United States Patent
Nakata et al.

(10) Patent No.: US 10,134,598 B2
(45) Date of Patent: Nov. 20, 2018

(54) METHOD FOR MANUFACTURING SEMICONDUCTOR DEVICE

(71) Applicant: Mitsubishi Electric Corporation, Tokyo (JP)

(72) Inventors: Kazunari Nakata, Tokyo (JP); Tamio Matsumura, Tokyo (JP); Yoshiaki Terasaki, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 4 days.

(21) Appl. No.: 15/321,245

(22) PCT Filed: Oct. 10, 2014

(86) PCT No.: PCT/JP2014/077207
§ 371 (c)(1),
(2) Date: Dec. 22, 2016

(87) PCT Pub. No.: WO2016/056124
PCT Pub. Date: Apr. 14, 2016

(65) Prior Publication Data
US 2017/0200613 A1    Jul. 13, 2017

(51) Int. Cl.
*H01L 23/48* (2006.01)
*H01L 21/02* (2006.01)
(Continued)

(52) U.S. Cl.
CPC ............ *H01L 21/304* (2013.01); *B24B 7/228* (2013.01); *B24B 27/0023* (2013.01);
(Continued)

(58) Field of Classification Search
CPC ............... H01L 21/304; H01L 21/3043; H01L 21/02035; B24B 7/228; B24B 37/042
See application file for complete search history.

(56) References Cited

U.S. PATENT DOCUMENTS

2005/0179127 A1* 8/2005 Takyu ................ H01L 21/6836
                                                           257/724
2007/0007247 A1    1/2007 Sekiya
(Continued)

FOREIGN PATENT DOCUMENTS

| JP | 2007-019379 A | 1/2007 |
| JP | 2009-176896 A | 8/2009 |
| JP | 2012-146889 A | 8/2012 |
| JP | 2012-216565 A | 11/2012 |
| JP | 5266869 B2 | 8/2013 |

OTHER PUBLICATIONS

Notification of Transmittal of Translation of the International Preliminary Report on Patentability (Chapter I) and Translation of Written Opinion of the International Searching Authority; PCT/JP2014/077207; dated Apr. 20, 2017.
(Continued)

*Primary Examiner* — Brian Turner
(74) *Attorney, Agent, or Firm* — Studebaker & Brackett PC (57) ABSTRACT

As a first grinding step, a peripheral portion of a back surface of a wafer (1) is ground with a first grindstone (17) to form a fractured layer (19) in the peripheral portion. Subsequently, as a second grinding step, a central portion of the back surface of the wafer (1) is ground with the first grindstone (17) to form a recess (21) while the peripheral portion in which the fractured layer (19) is formed is left as a rib (20). Subsequently, as a third grinding step, a bottom surface of the recess (21) is ground with a second grindstone (22) of an abrasive grain size smaller than that of the first grindstone (17) to reduce a thickness of the wafer (1).

9 Claims, 9 Drawing Sheets (51) Int. Cl.
  *B24D 3/00* (2006.01)
  *H01L 21/301* (2006.01)
  *B24B 1/00* (2006.01)
  *H01L 21/304* (2006.01)
  *H01L 21/306* (2006.01)
  *H01L 21/683* (2006.01)
  *H01L 21/66* (2006.01)
  *B24B 27/00* (2006.01)
  *B24B 49/12* (2006.01)
  *B24B 7/22* (2006.01)

(52) U.S. Cl.
  CPC ........ *B24B 49/12* (2013.01); *H01L 21/30604* (2013.01); *H01L 21/6836* (2013.01); *H01L 22/20* (2013.01); *H01L 22/12* (2013.01); *H01L 2221/6834* (2013.01); *H01L 2221/68327* (2013.01)

(56) References Cited

U.S. PATENT DOCUMENTS

2009/0186563 A1* 7/2009 Takahashi ............... B24B 7/228
  451/57
2013/0001766 A1* 1/2013 Takyu .................. H01L 21/304
  257/734

OTHER PUBLICATIONS

An Office Action issued by the Japanese Patent Office dated Mar. 21, 2017, which corresponds to Japanese Patent Application No. 2016-552785 and is related to U.S. Appl. No. 15/321,245; with English language partial translation.

JP Office Action dated Aug. 8, 2017, from corresponding JP Appl No. 2016-552785, with partial English translation, 5 pp.

* cited by examiner

METHOD FOR MANUFACTURING SEMICONDUCTOR DEVICE

FIELD

The present invention relates to a method for manufacturing a semiconductor device capable of inhibiting breakage of a wafer during machining of the wafer without reducing the productivity.

BACKGROUND

The packing density in packages for LSIs has been increased by three-dimensional packaging, etc., and progress has been made in reducing the thickness of wafers to achieve a wafer thickness of about 25 µm at the time of completion of the process. Power devices such as insulated-gate bipolar transistors (IGBTs) and MOS-type field effect transistors (MOSFETs) are being widely used as semiconductor switches in inverter circuits for industrial motors, vehicle motors, etc., power supplies for large-capacity servers, and uninterruptible power supplies. Semiconductor substrates for such power semiconductor devices are machined to a reduced thickness for the purpose of improving energization performance characteristics typified by an on-characteristic. In recent years, semiconductor devices have been manufactured by using, for improvements in terms of cost and characteristics, an extremely-thin-wafer process in which the thickness of a wafer manufactured by a floating zone (FZ) method is reduced to about 50 µm.

Wet etching or dry etching for removing work strain caused by grinding in a way of back grinding or polishing or by mechanical polishing is ordinarily used for machining a wafer to a reduced thickness. Forming of a diffusion layer on the back surface side by means of ion implantation and a heat treatment is performed and forming of an electrode is thereafter performed, for example, by means of sputtering. Under such circumstances, the frequency of occurrence of wafer breakage in machining of the back surfaces of wafers has been increased. In recent years, therefore, machining methods of machining a wafer so that only a central portion of the wafer is thinned while leaving a peripheral portion thick as a rib have been proposed for making wafers small in thickness (see, for example, PTL 1).

If a wafer with such a rib is used, a markedly high effect of limiting a warp of the wafer can be achieved and the facility with which the wafer is transported in a processing apparatus can be improved. Further, in handling of the wafer, the wafer has a markedly improved strength and the occurrence of cracking or chipping of the wafer can be reduced. A method has also been proposed which provides, in a wafer with such a rib, a transition region where the wafer is gradually reduced in thickness from the rib to the thinned portion, whereby wafer breakage is prevented in a step of heat treatment on the wafer with the rib (see, for example, PTL 2).

CITATION LIST

Patent Literature

[PTL 1] JP 2007-19379 A
[PTL 2] JP 5266869

SUMMARY

Technical Problem

If a flaw such as chipping occurs in the rib when the rib is formed, the strength of the wafer is reduced, resulting in the occurrence of wafer breakage during machining of the wafer. In a case where the transition region is provided, a taper at an angle of 15 to 45 degrees is formed in an end portion of the wafer and the effective area on a peripheral portion of the wafer usable as a device area is thereby reduced, resulting in a reduction in productivity.

The present invention has been achieved to solve the above-described problem, and an object of the present invention is to obtain a method for manufacturing a semiconductor device capable of inhibiting breakage of a wafer during machining of the wafer without reducing the productivity.

Solution to Problem

A method for manufacturing a semiconductor device according to the present invention includes: a step of forming a plurality of semiconductor devices in a front surface of a wafer; a first grinding step of grinding a peripheral portion of a back surface of the wafer with a first grindstone to form a fractured layer in the peripheral portion; a second grinding step of grinding a central portion of the back surface of the wafer with the first grindstone to form a recess while the peripheral portion in which the fractured layer is formed is left as a rib; and a third grinding step of grinding a bottom surface of the recess with a second grindstone of an abrasive grain size smaller than that of the first grindstone to reduce a thickness of the wafer.

Advantageous Effects of Invention

In the present invention, the peripheral portion of the back surface of the wafer is ground to provide the fractured layer before the recess is formed. Chipping of the rib from which a wafer cracking starts can thereby be inhibited, thus enabling inhibition of wafer breakage during machining of the wafer. Also, the effective area is not reduced and the productivity is not lowered, because there is no need to form a taper in an end portion of the wafer as in the conventional art.

DESCRIPTION OF EMBODIMENTS

A method for manufacturing a semiconductor device according to the embodiments of the present invention will be described with reference to the drawings. The same components will be denoted by the same symbols, and the repeated description thereof may be omitted.

Embodiment 1

Figure 1:
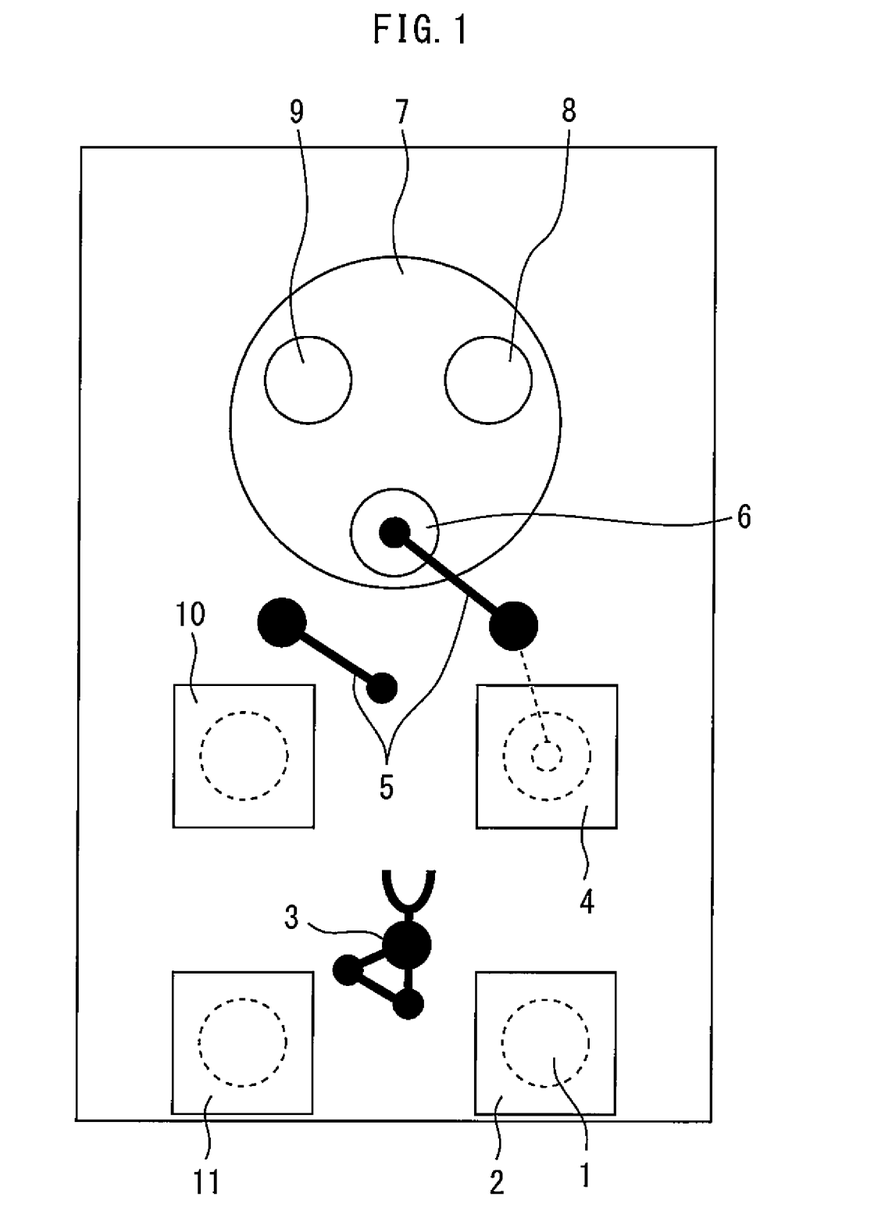
FIG. 1 is a plan view of a back grinding apparatus according to Embodiment 1 of the present invention.

FIG. 1 is a plan view of a back grinding apparatus according to Embodiment 1 of the present invention. A wafer 1 to which a surface protective tape is attached is set in a wafer cassette 2 and is transported to an alignment mechanism 4 by a transport robot 3. Subsequently, wafer centering is performed with the alignment mechanism 4 and the wafer 1 is transported to a wafer delivery part 6 by a transport arm 5. Subsequently, a grinding stage 7 is rotated counterclockwise as viewed in the figure and the wafer 1 is moved to a uniaxial grinding stage 8. In the uniaxial grinding stage 8, first and second grinding steps are performed.

Subsequently, the grinding stage 7 is further rotated counterclockwise and the wafer 1 is moved to a biaxial grinding stage 9. In the biaxial grinding stage 9, a third grinding step is performed. A rib is formed at the periphery of the wafer 1 by the first, second and third grinding steps. The wafer 1 is then transported to a wafer cleaning mechanism 10 by the transport arm 5 and cleaned with water and dried. The wafer 1 is then retrieved into the wafer cassette 11 by the transport robot 3.

Figure 2:
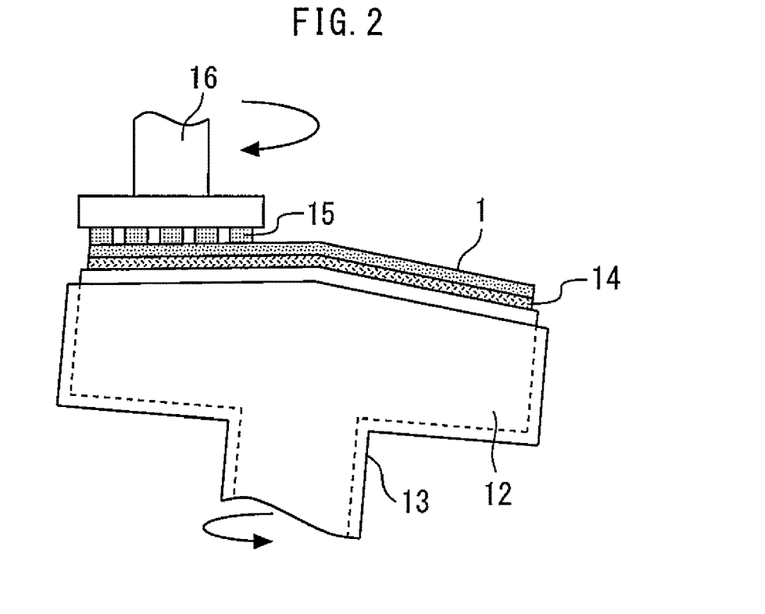
FIG. 2 is a sectional view showing a state in the grinding steps.
Figure 3:
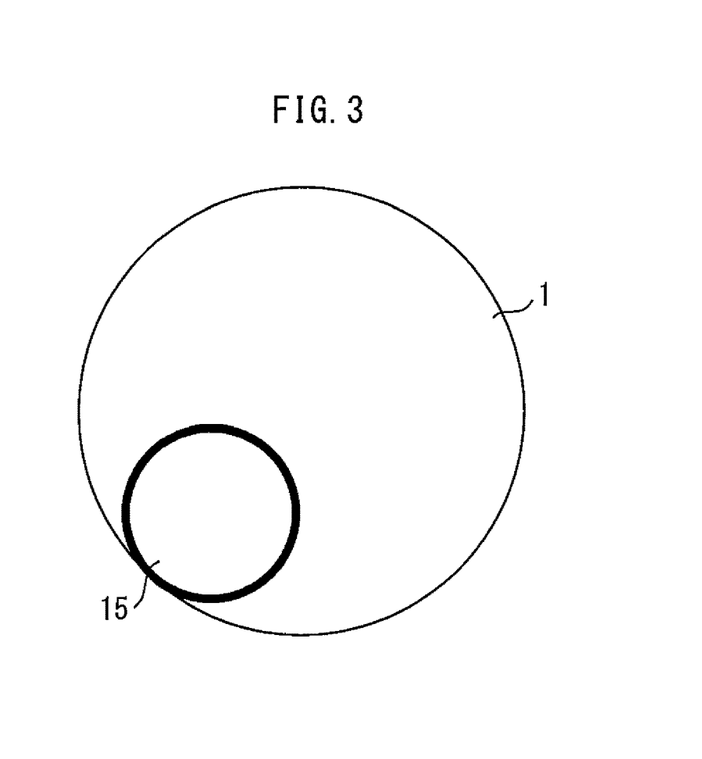
FIG. 3 is a top view showing a state in the grinding steps.

FIGS. 2 and 3 are a sectional view and a top view, respectively, showing a state in the grinding steps. An adsorption stage 12 and a stage cover 13 are compatible with the uniaxial grinding stage 8 and a biaxial grinding stage 9 shown in FIG. 1. The front surface side of the wafer 1 to which a protective tape 14 is adhered is adsorbed to the adsorption stage 12 and is rotated in a predetermined direction at a speed of, for example, about 300 rpm. A grinding wheel 16 on which grindstone 15 is set is slowly brought into contact with the wafer 1 from above at a speed of about 4000 rpm, thus performing the grinding step.

Figure 7:
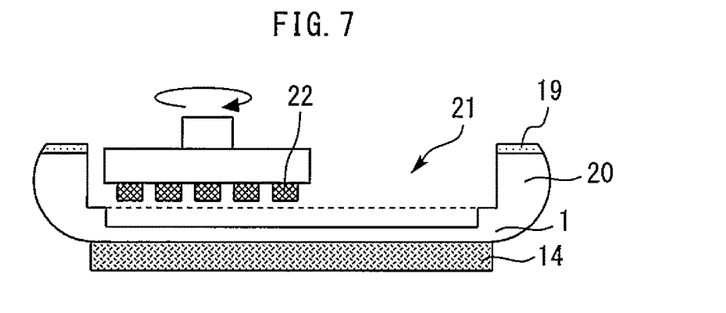
FIG. 7 is a sectional view showing a method of manufacturing the semiconductor device according to Embodiment 1 of the present invention.
Figure 8:
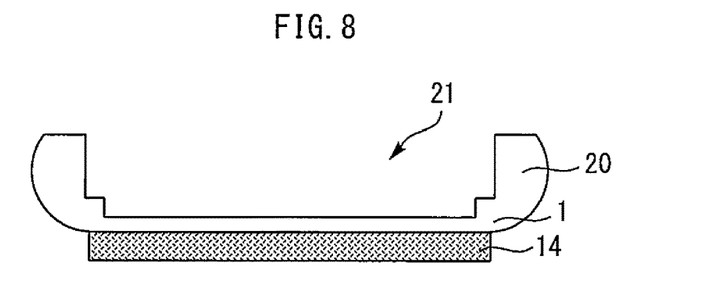
FIG. 8 is a sectional view showing a method of manufacturing the semiconductor device according to Embodiment 1 of the present invention.
Figure 9:
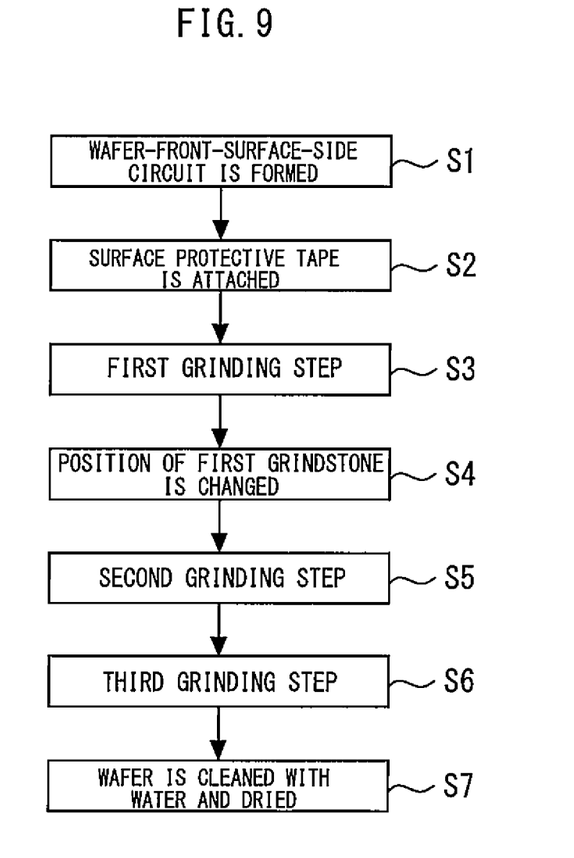
FIG. 9 is a flowchart of the method of manufacturing the semiconductor device according to Embodiment 1 of the present invention.

FIGS. 4 to 8 are sectional views showing a method of manufacturing the semiconductor device according to Embodiment 1 of the present invention. FIG. 9 is a flowchart of the method of manufacturing the semiconductor device according to Embodiment 1 of the present invention. The semiconductor device to be manufactured is a vertical-type semiconductor device such as an IGBT, a MOSFET or a diode.

First, a wafer 1 of an n-type semiconductor is prepared, p-type and n-type impurity layers are formed in a front surface of the wafer 1, and gate electrodes are thereafter formed, for example, from polysilicon. Subsequently, a wiring layer for leading out transistors and the gate electrodes to the outside is formed on the front surface by using a metal material such as aluminum. A wafer-front-surface-side circuit is formed thereby (step S1). The wafer-front-surface-side circuit has a device region in which a plurality of semiconductor devices are sectioned by prearranged division lines, and a peripheral surplus region surrounding the device region.

Figure 4:
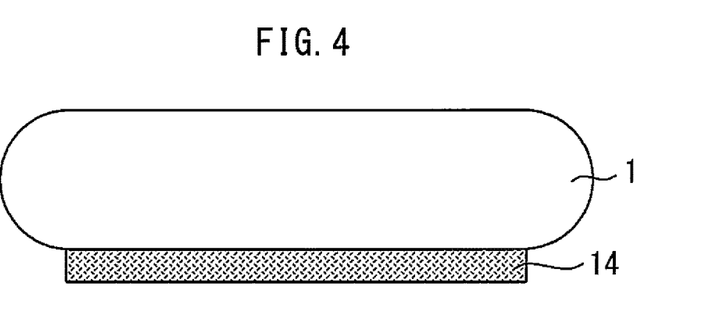
FIG. 4 is a sectional view showing a method of manufacturing the semiconductor device according to Embodiment 1 of the present invention.
Figure 5:
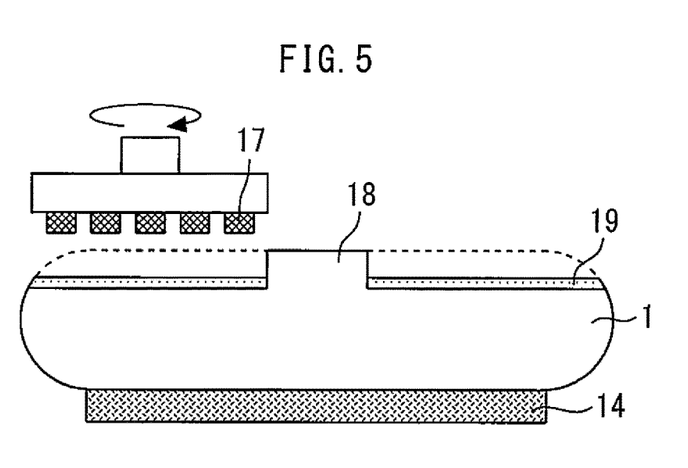
FIG. 5 is a sectional view showing a method of manufacturing the semiconductor device according to Embodiment 1 of the present invention.

Subsequently, as shown in FIG. 4, the surface protective tape 14 is attached to the front surface of the wafer 1 (step S2). Subsequently, as shown in FIG. 5, grinding of a peripheral portion of the back surface of the wafer 1 with a first grindstone 17 is performed as the first grinding step (step S3). In this step, a central portion of the back surface of the wafer 1 is left as an unground region 18. A machined fractured layer 19 is formed in the ground peripheral portion.

Figure 6:
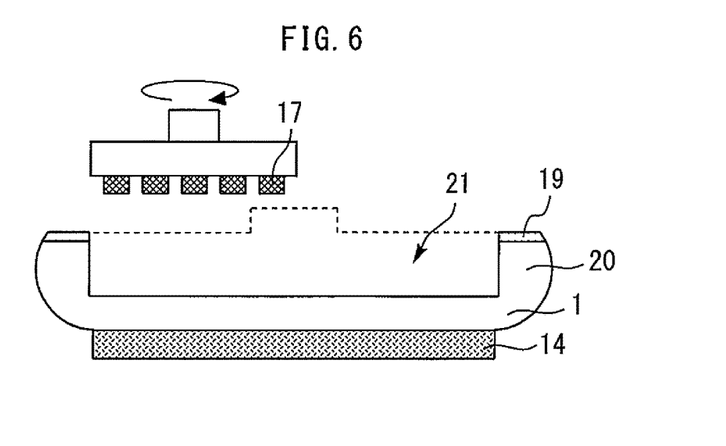
FIG. 6 is a sectional view showing a method of manufacturing the semiconductor device according to Embodiment 1 of the present invention.

Subsequently, as shown in FIG. 6, the relative position between the first grindstone 17 and the wafer 1 is changed (step S4). The position of the first grindstone 17 is shifted to a predetermined extent, for example, by using a servomotor. Subsequently, a predetermined amount of grinding with the first grindstone 17 of the central portion of the back surface of the wafer 1 including the unground region 18 is performed as the second grinding step to form a recess 21 (step S5), while a part of the peripheral portion in which the fractured layer 19 is formed is left as a rib 20.

Subsequently, as shown in FIG. 7, grinding of the bottom surface of the recess 21 with a second grindstone 22 of an abrasive grain size smaller than that of the first grindstone 17 is performed as the third grinding step to reduce the thickness of the wafer 1 to a set thickness (step S6). The wafer 1 is cleaned with water and dried (step S7). Subsequently, as shown in FIG. 8, the fractured layer 19 is removed by wet etching using a mixture acid including hydrofluoric acid and nitric acid. The wafer 1 having the rib 20 is formed by the above-described process.

Thereafter, introduction of an impurity by ion implantation, activation of the impurity using a diffusion furnace or laser and forming of a wiring layer for leading out electricity to the outside and electrodes for connection to a circuit board are performed on the back surface of the wafer 1. A warp of the wafer 1 as a result of making the wafer 1 thin makes wafer transport difficult. However, a markedly high effect of limiting a warp of the wafer 1 is obtained as a result of forming the rib 20 by back grinding as described above, thus facilitating wafer transport in the process apparatus. Also, the strength of the wafer is markedly improved and the occurrence of cracking or chipping during handling of the wafer 1 can therefore be reduced.

Figure 10:
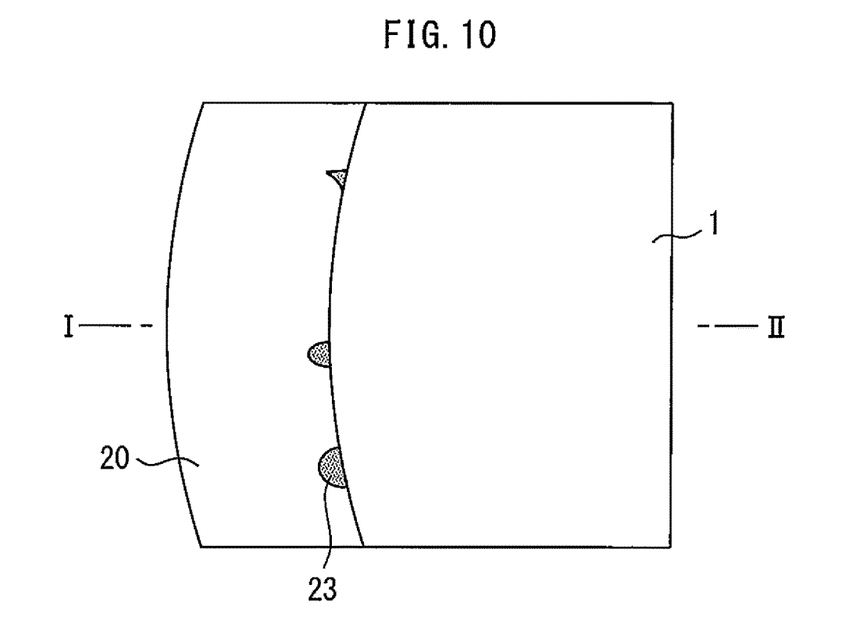
FIG. 10 is a top view of an outer end portion of the wafer reduced in thickness.
Figure 11:
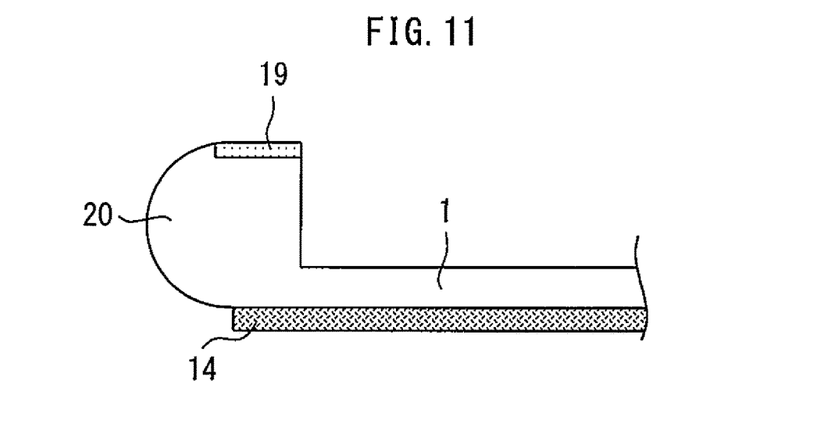
FIG. 11 is a sectional view taken along line I-II in FIG. 10.

FIG. 10 is a top view of an outer end portion of the wafer reduced in thickness. FIG. 11 is a sectional view taken along line I-II in FIG. 10. The peripheral thick portion of the wafer 1 is the rib 20, and the portion of the wafer 1 machined to a reduced thickness is the device region. A chipping 23 occurs in the rib 20 on the device region side as a result of the first, second and third grinding steps. If stress is caused in the wafer 1 when the wafer 1 is handled, the wafer 1 can be cracked from the chipping 23.

In the present embodiment, the peripheral portion of the back surface of the wafer 1 is ground to provide the fractured layer 19 before the recess is formed. Chipping 23 of the rib 20 from which a wafer cracking starts can thereby be inhibited, thus enabling inhibition of wafer breakage during machining of the wafer. Also, the effective area is not reduced and the productivity is not lowered, because there is no need to form a taper in an end portion of the wafer 1 as in the conventional art.

When the semiconductor devices are formed at the front surface side of the wafer, an insulating film such as silicon oxide film is also formed at the back surface side of the wafer. In the conventional process, a large step is formed in the rib 20 with the insulating film acting as a mask in wet etching after grinding, resulting in the occurrence of adsorption failure when the rib is adsorbed for wafer handling in a post-process. In the present embodiment, the insulating film on the peripheral portion of the back surface of the wafer 1 is removed by the first grinding step, thus enabling prevention of forming of a large step in the rib 20.

Figure 12:
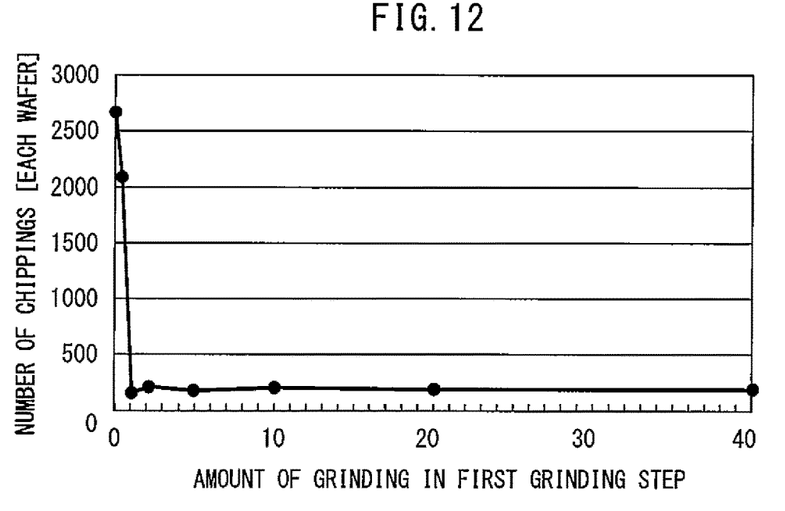
FIG. 12 is a diagram showing the amount of grinding in the step of providing the fractured layer and the number of chippings of 50 μm or more.

FIG. 12 is a diagram showing the amount of grinding in the step of providing the fractured layer and the number of chippings of 50 μm or more. A chipping of 50 μm or more leads to wafer cracking. When the amount of grinding was smaller than 1 μm, a silicon wafer monocrystalline condition in the ground surface in the peripheral portion of the back surface of the wafer was maintained. Large chippings of 50 μm or more therefore occurred in the wafer receiving force from the grindstone in the second grinding step. When the amount of grinding in the first grinding step was 1 μm or more, the number of chippings of 50 μm or more which could lead to wafer cracking was markedly reduced because of the provision of the fractured layer in the ground surface of the wafer peripheral portion by machining, although the wafer receiving force from the grindstone had fine chippings.

Figure 13:
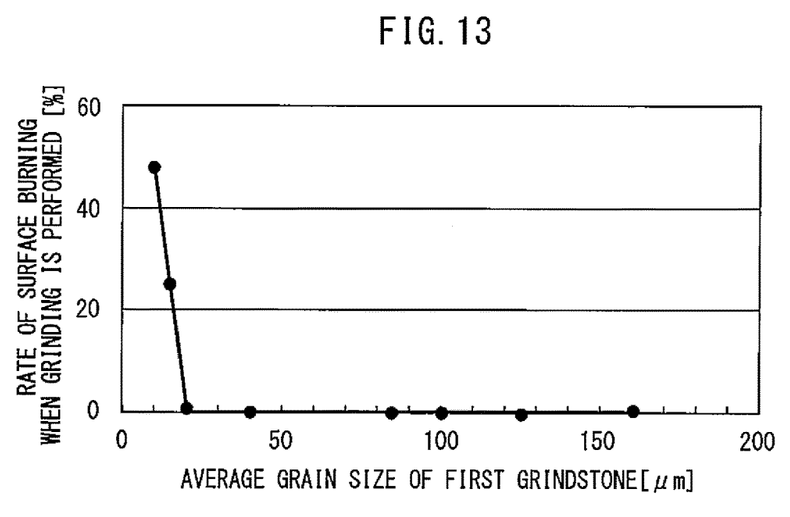
FIG. 13 is a diagram showing the average grain size of the first grindstone and the rate of surface burning when grinding is performed.

FIG. 13 is a diagram showing the average grain size of the first grindstone and the rate of surface burning when grinding is performed. Surface burning is a phenomenon in which when the grindstone whose grinding force is reduced is pushed against the wafer at a constant speed, the wafer surface abraded with the grindstone turns black. When the average grain size of the first grindstone 17 becomes smaller, the grinding force is reduced. When the average grain size is equal to or smaller than 20 μm, the frequency of surface burning is increased. It is, therefore, preferable that the average grain size of the first grindstone 17 be equal to or larger than 20 μm. This enables grinding to be performed with stability without surface burning even if insulating film, polysilicon film or the like remains on the wafer back surface side.

Figure 14:
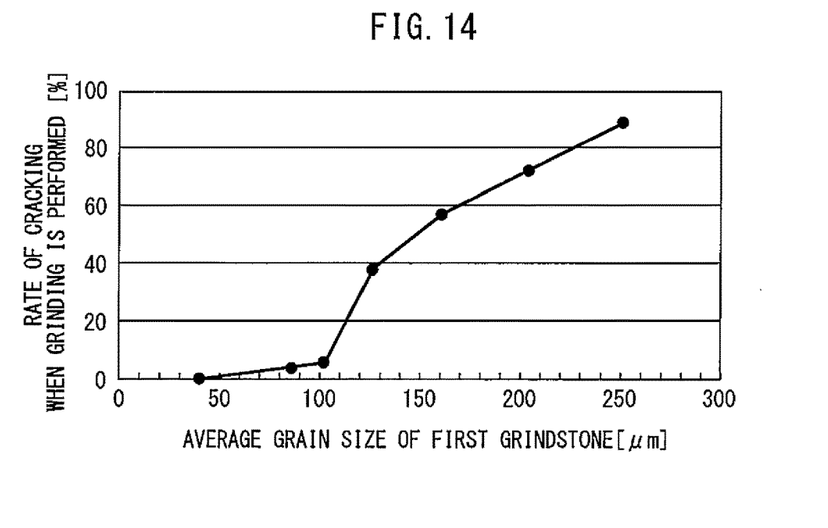
FIG. 14 is a diagram showing the average grain size of the first grindstone and the rate of cracking when grinding is performed.

FIG. 14 is a diagram showing the average grain size of the first grindstone and the rate of cracking when grinding is performed. The rate of cracking increases when the average grain size of the first grindstone 17 is larger than 100 μm. It is, therefore, preferable that the average grain size of the first grindstone 17 be equal to or smaller than 100 μm. This enables prevention of wafer cracking during grinding.

Also, it is preferable that the average grain size of the second grindstone 22 be equal to or smaller than 10 μm. This enables securing the strength of the wafer 1 and inhibiting wafer cracking under handling even after the wafer 1 has been reduced in thickness.

Embodiment 2

In Embodiment 2, the width of the unground region 18 is measured after the first grinding step, and the position of the first grindstone in the second grinding step is determined on the basis of the measured value of the width. The other steps are the same as those in Embodiment 1.

Figure 15:
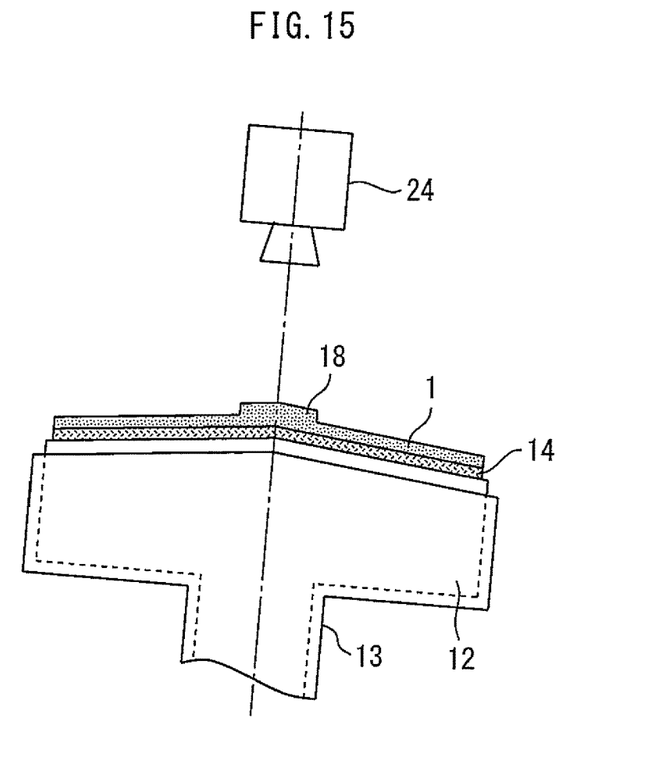
FIG. 15 is a sectional view showing a method of measuring the width of the unground region according to Embodiment 2 of the present invention.

FIG. 15 is a sectional view showing a method of measuring the width of the unground region according to Embodiment 2 of the present invention. An image of the wafer taken with a camera 24 is subjected to image processing to measure the width of the unground region 18. The amount of wear in the first grindstone 17 can be known from the width of the unground region 18. The width of the rib 20 can therefore be set to the desired value by determining the position of the first grindstone 17 according to the amount of wear in the first grindstone 17. Also, image processing on the wafer image enables measuring the amount of wear in the first grindstone 17 at a high speed in a noncontact manner.

Figure 16:
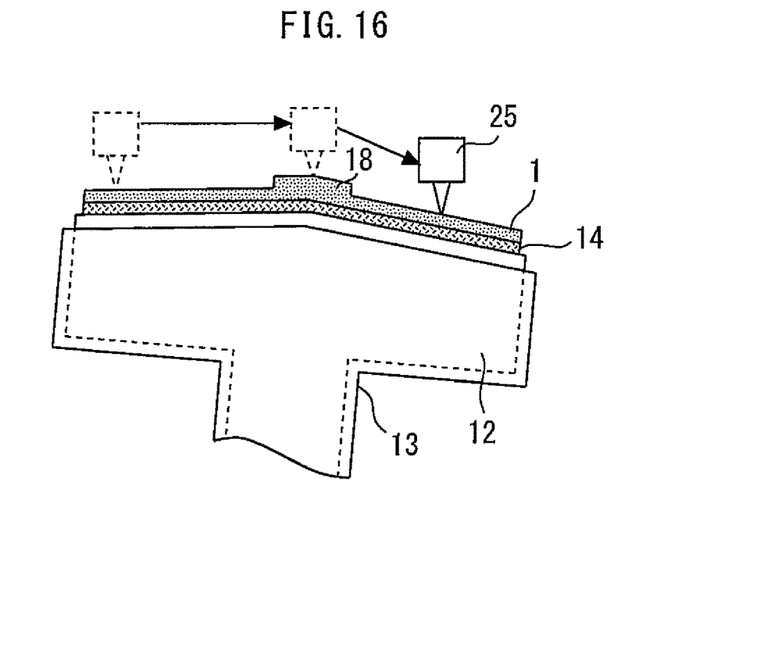
FIG. 16 is a sectional view showing another method of measuring the width of the unground region according to Embodiment 2 of the present invention.
Figure 17:
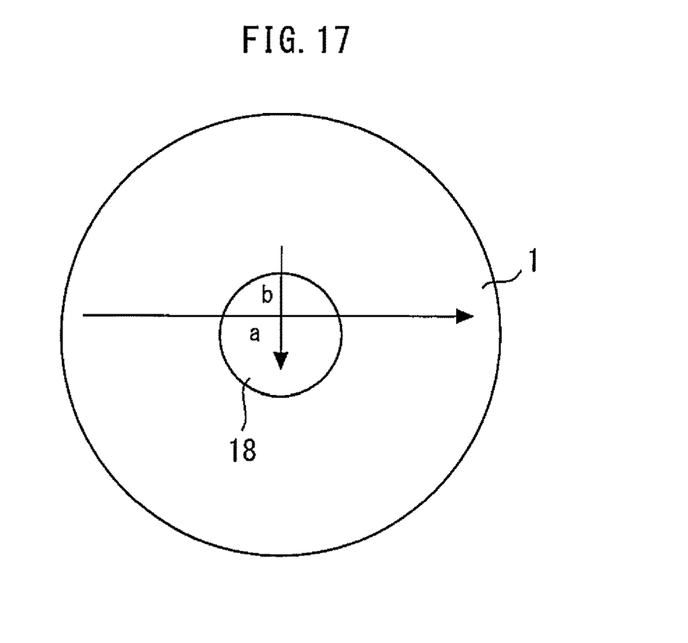
FIG. 17 is a plan view showing another method of measuring the width of the unground region according to Embodiment 2 of the present invention.

FIGS. 16 and 17 are a sectional view and a plan view, respectively, showing another method of measuring the width of the unground region according to Embodiment 2 of the present invention. Scanning with a step measuring probe 25 is performed along a straight line so as to pass through a region including a center of the wafer 1. Scanning with the step measuring probe 25 is then performed along a direction perpendicular thereto so as to pass through a center of the width of the projection of the unground region 18 thereby obtained. If the widths of the projection of the unground region 18 respectively measured thereby are 2× a and 2× b, the width D of the unground region 18 can be obtained by $D=(a^2+b^2)/b$ using the Pythagoras' theorem. By this measuring method, the width of the unground region can be obtained with accuracy even in a case where the amount of grinding in the first grinding step is small and the contact of the image is low.

REFERENCE SIGNS LIST

1 wafer; 17 first grindstone; 18 unground region; 19 fractured layer; 20 rib; 21 recess; 22 second grindstone

The invention claimed is:

1. A method for manufacturing a semiconductor device comprising:
    a step of forming a plurality of semiconductor devices in a front surface of a wafer;
    a first grinding step of grinding a peripheral portion of a back surface of the wafer with a first grindstone to form a fractured layer in the peripheral portion while a central portion of the back surface of the wafer is not ground and is left as an unground region in the first grinding step;
    a second grinding step of grinding the central portion of the back surface of the wafer with the first grindstone to form a recess while the peripheral portion in which the fractured layer is formed is left as a rib; and
    a third grinding step of grinding a bottom surface of the recess with a second grindstone of an abrasive grain size smaller than that of the first grindstone to reduce a thickness of the wafer.

2. The method for manufacturing a semiconductor device according to claim 1, further comprising a step of removing the fractured layer by wet etching after the third grinding step.

3. The method for manufacturing a semiconductor device according to claim 1, wherein
    a relative position between the first grindstone and the wafer is changed and the unground region is ground in the second grinding step.

4. The method for manufacturing a semiconductor device according to claim 3, wherein a position of the first grindstone in the second grinding step is determined on the basis of a measured value of a width of the unground region.

5. The method for manufacturing a semiconductor device according to claim 4, wherein an image of the wafer is subjected to image processing to measure the width of the unground region.

6. The method for manufacturing a semiconductor device according to claim 4, wherein a step of the unground region is measured along a diameter direction of the wafer to obtain the width of the unground region.

7. The method for manufacturing a semiconductor device according to claim 1, wherein an amount of grinding in the step of providing the fractured layer is 1 μm or more.

8. The method for manufacturing a semiconductor device according to claim 1, wherein an average grain size of the first grindstone is equal to or larger than 20 μm and equal to or smaller than 100 μm.

9. The method for manufacturing a semiconductor device according to claim 1, wherein an average grain size of the second grindstone is equal to or smaller than 10 μm.

* * * * *